(12) United States Patent
Melik-Martirosian

(10) Patent No.: US 7,929,353 B2
(45) Date of Patent: Apr. 19, 2011

(54) METHOD AND APPARATUS FOR ADAPTIVE MEMORY CELL OVERERASE COMPENSATION

(75) Inventor: Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/574,079

(22) Filed: Oct. 6, 2009

(65) Prior Publication Data
US 2010/0020607 A1     Jan. 28, 2010

Related U.S. Application Data

(62) Division of application No. 11/613,379, filed on Dec. 20, 2006, now Pat. No. 7,619,934.

(51) Int. Cl.
G11C 11/34     (2006.01)
(52) U.S. Cl. .............. 365/185.3; 365/185.18; 365/185.2
(58) Field of Classification Search .............. 365/185.3, 365/185.18, 185.2, 185.23, 230.06, 239, 365/189.07
See application file for complete search history.

(56) References Cited

U.S. PATENT DOCUMENTS

| | | | |
|---|---|---|---|
| 6,735,114 B1 * | 5/2004 | Hamilton et al. | 365/185.03 |
| 2004/0257873 A1 * | 12/2004 | Shieh et al. | 365/185.2 |
| 2006/0158940 A1 * | 7/2006 | Shappir et al. | 365/185.29 |

\* cited by examiner

*Primary Examiner* — Dang T Nguyen

(57) ABSTRACT

A method and apparatus are provided for adaptive memory cell overerase compensation. A semiconductor memory device (100) is provided for performing the adaptively compensating erase verify operation (500, 600). The memory device (100) includes at least one word line (402). One or more memory cells (200) and one or more reference cells (406, 408) are connected to the word lines (402), where the one or more reference cells (406, 408) include an erased reference cell (408) connected to each word line (402). The method (500, 600) for adaptive memory cell overerase compensation includes determining an erase verify gate voltage (506, 608) utilizing the erased reference cell(s) (408) and verifying an erase voltage (514) of the memory cells (200) in response to the erase verify gate voltage (512, 614).

12 Claims, 5 Drawing Sheets

METHOD AND APPARATUS FOR ADAPTIVE MEMORY CELL OVERERASE COMPENSATION

CROSS-REFERENCES TO RELATED APPLICATIONS

This Application is a Divisional of U.S. patent application Ser. No. 11/613,379, filed Dec. 20, 2006.

FIELD OF THE DISCLOSURE

The present invention generally relates to semiconductor memory devices, and more particularly relates to a method and apparatus for adaptively compensating for memory cell degradation due to overerase in semiconductor memory devices.

BACKGROUND OF THE DISCLOSURE

Semiconductor memory devices include a memory cell array wherein data is stored in memory cells in the memory cell array. Conventionally, after memory cells are erased, an erase verify operation is performed to verify that the memory cell is fully erased. Erase verify is typically performed by comparing a current across a memory cell to a constant reference current. As memory cells are programmed and erased (generally referred to as cycling), their electrical characteristics degrade, resulting in reduced cell current at a given voltage. Effectively, the cycled memory cells are overerased. Currents at voltages below the memory cell threshold voltage are significantly increased in cycled cells due to cycling degradation of the memory cell and overerase thereof. The increased subthreshold current increases bitline-to-bitline current leakage under unselected word lines when a selected memory cell is programmed or soft-programmed. The increased bitline-to-bitline current leakage increases total programming current, thereby increasing power consumption during programming. In addition, the drain voltage on the bitline must necessarily be increased to overcome the voltage drop due to the bitline-to-bitline leakage, thereby negatively impacting the operation of the DC-DC charge pumps.

Accordingly, it is desirable to provide a method and apparatus for adaptively compensating for memory cell degradation due to overerase in semiconductor memory devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE DISCLOSURE

A method is provided for performing erase verify in a semiconductor memory which includes one or more memory cells and at least one erased reference cell. The method includes determining an erase verify gate voltage utilizing the erased reference cell(s) and verifying an erase voltage of the memory cells in response to the erase verify gate voltage.

A semiconductor memory device is provided for performing an adaptively compensating erase verify operation. The memory device includes at least one word line. One or more memory cells and one or more reference cells are connected to the word lines, where the one or more reference cells include an erased reference cell connected to each word line.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
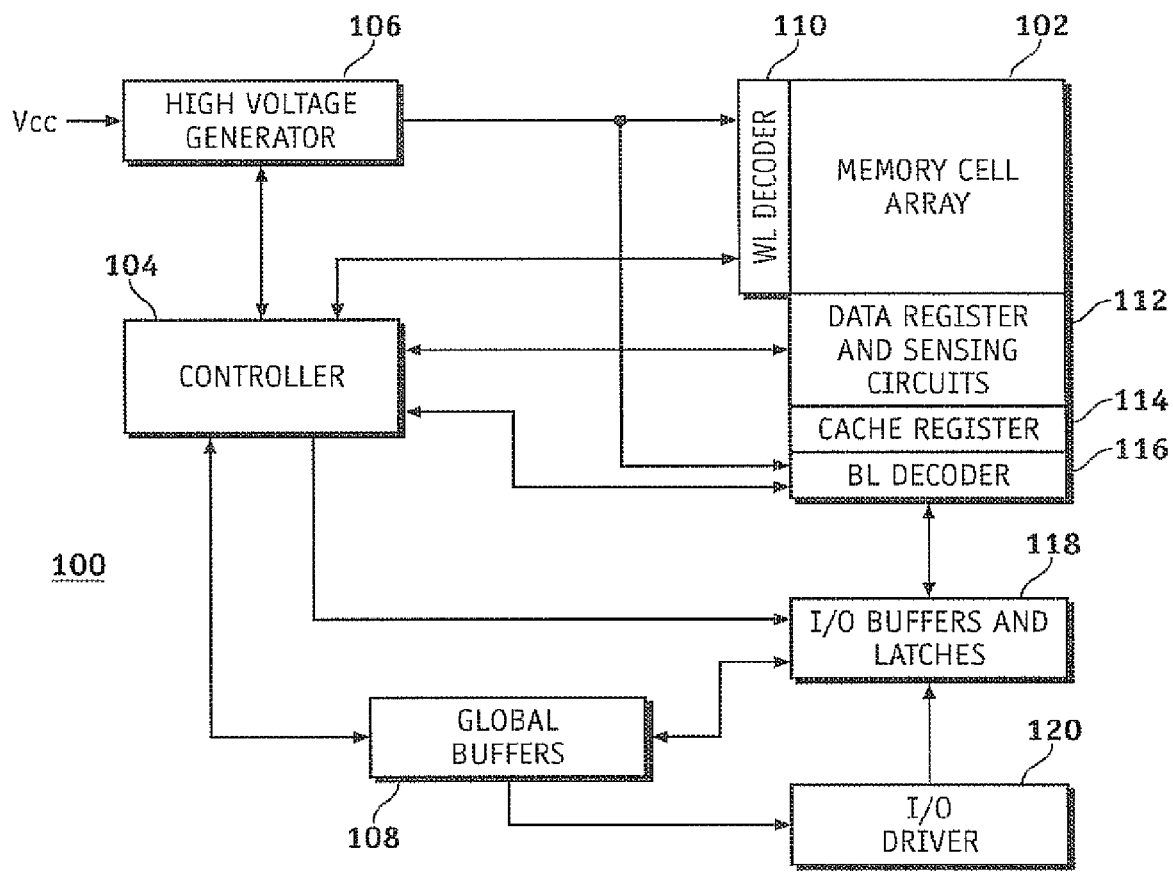
FIG. 1 is a block diagram of a semiconductor memory device in accordance with an embodiment of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Before describing in detail embodiments that are in accordance with the present invention, it should be observed that the embodiments reside primarily in methods and semiconductor memory devices for performing adaptively compensating erase verify and program verify operations. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," or "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIG. 1, a non-volatile semiconductor memory device 100 in accordance with an embodiment of this disclosure, such as a Flash memory device, includes a memory cell array 102 and a controller 104, the controller 104 including a command register, an address register and decoder and other control logic. The semiconductor memory device 100 also includes a high-voltage generator 106, a global buffer 108, a word line decoder 110, a data register and sensing circuit 112, a cache register 114, a bitline decoder 116 for performing bitline decoding, an Input/Output (I/O) buffer and latch circuit 118, and an input/output driver 120.

The memory cell array 102 includes a plurality of rewritable non-volatile memory cells that are arranged along word lines and bitlines in a matrix fashion well-known to those skilled in the art. In order to perform memory operations, such as programming operations, erase operations or read operations, selected memory cells from among the plurality of memory cells are selected by providing voltage levels on word lines and bitlines associated with the selected memory cells under control of the controller 104. In accordance with the embodiment, the plurality of rewritable non-volatile memory cells of the memory cell array 102 also include reference cells, such as dynamic reference cells, for performing verify operations such program verify and erase verify operations (i.e., checking whether sufficient write/erase has been performed on a subject memory cell at the time of programming or erasing data). The memory cell array 102 may also include static reference cells.

The high-voltage generator 106 generates voltage signals having high voltage levels that are used within the semiconductor device for memory operations thereof by applying the high voltages to selected cells within the memory cell array 102 via the word line decoder 110 and the bitline decoder 116. The high voltage signals used within the semiconductor memory device 100 include voltage signals for writing data, erasing data, reading data, and verifying data. In order to generate the high voltage signals, the high-voltage generator 106 typically includes a plurality of DC-DC converters called charge pumps to convert the operational voltage Vcc to the necessary high voltage signals.

Operation commands input through the global buffer 108 are provided to the controller 104 and include input address signals. The I/O buffer and latch circuit 118 controls various signals or data corresponding to I/O terminals, while the input/output driver 120 controls the data to be output from the semiconductor memory device 100 and the data to be input thereto.

Figure 2:
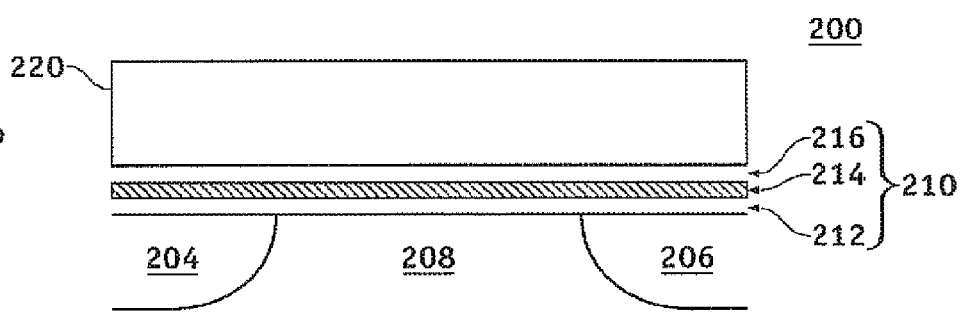
FIG. 2 is diagram of memory cell of the semiconductor memory device of FIG. 1 in accordance with the embodiment.

In accordance with the embodiment of this disclosure, the plurality of rewritable memory cells of the memory cell array 102 are multi-bit, nonvolatile memory cells. Referring to FIG. 2, a multi-bit, non-volatile memory cell 200 of the memory cell array 102 is provided on a semiconductor substrate 202 having a source 204 and drain 206 formed therein with a channel region 208 formed therebetween. An oxide-nitride-oxide (ONO) layer 210 is formed on the substrate 202 having a lower oxide layer 212, a nitride charge trapping layer 214 and a protective oxide layer 216. A polysilicon gate 220 is formed on the ONO layer 210 and may be coupled to a word line for performing memory operations.

As the charge trapping nitride layer 214 is insulative, multiple bits of data can be stored as electron charge in a localized storage region therein through a high voltage programming operation. In accordance with the embodiment, the multi-bit memory cell is a two-bit memory cell and there are two localized storage regions formed in the nitride charge trapping layer 214 above the source 204 and the drain 206. The source 204 and the drain 206 of each memory cell 200 may be coupled to a bitline for performing program, erase and read operations.

Figure 3:
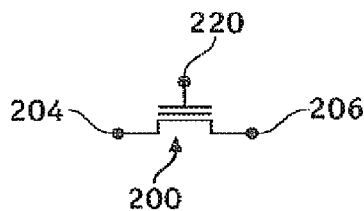
FIG. 3 is a schematic diagram of the memory cell of FIG. 2 in accordance with the embodiment.

Referring to FIG. 3, a schematic diagram of the memory cell 200 in accordance with the embodiment depicts each memory cell as a transistor 200 with the polysilicon word line 220 controlling the flow of current between the source 204 and the drain 206. To access the two bits of the memory cell 200, the source 204 and the drain are interchangeable.

Figure 4:
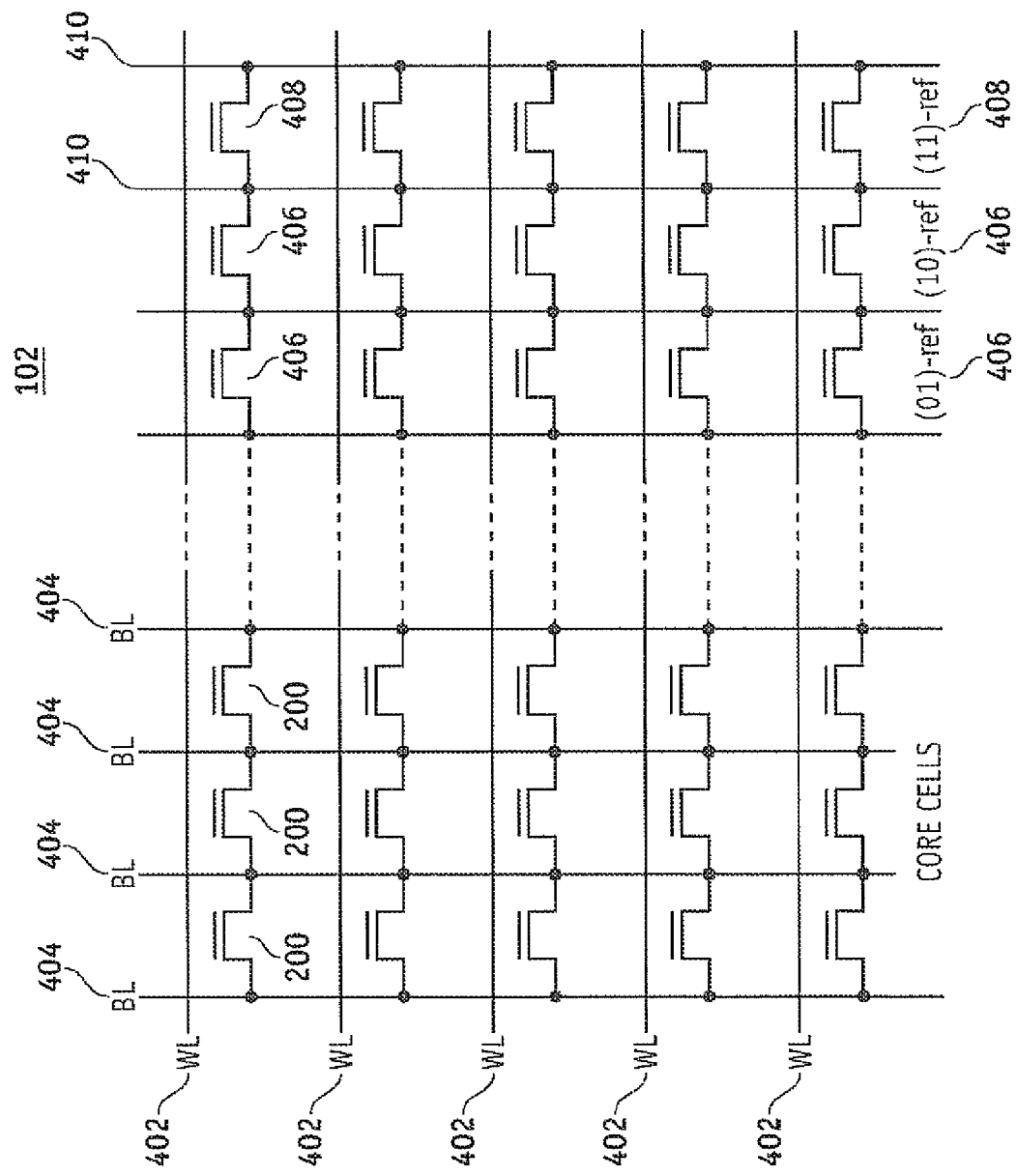
FIG. 4 is a layout view of a memory cell array of the semiconductor memory device of FIG. 1 in accordance with the embodiment.

Referring to FIG. 4, a portion of the memory cell array 102 in accordance with the embodiment of this disclosure includes a plurality of memory cells 200 connected to word lines (WLs) 402 and bitlines (BLs) 404. Connected to each word line 402 are conventional dynamic reference cells 406 for use in memory operations such as erase verify operations and program verify operations. In accordance with this embodiment, an erased reference cell 408 is also connected to each word line 402. When performing erase verify operations in accordance with the embodiment, the dynamic reference cells 406 are selectively used as erase verify reference cells for either one of the dual bits of the memory cells while the erased reference cell 408 is used to provide adaptive over-erase compensation.

During cycling of the memory cells 200 as the memory cells are programmed and erased, measured linear transconductance (Gm) degradation reduces the drain-to-source current (Ids) of the memory cells 200 at a given gate voltage (Vg). Since an erase verify operation is typically performed by comparing the Ids current of an erase memory cell 200 to constant erase verify reference current ($I_{EV}$), cycled memory cells 200 become overerased. Subthreshold current increases significantly in cycled memory cells 200, both as a result of cycling degradation of the memory cells 200 and as a result of overerase. The increased subthreshold current causes increased leakage between the bitlines 404 of memory cells 200 connected to unselected word lines 402 when memory cells 200 connected to selected word lines 402 are programmed or soft-programmed (i.e., bitline-to-bitline leakage, $I_{leak}$).

The bitline-to-bitline leakage, $I_{leak}$, significantly increases the total current required for programming current (i.e., $I_{tot}=I_{pr}+I_{leak}$) and, therefore, the total power consumption during programming. Additionally, the drain voltage ($V_d$) must necessarily be raised due to the extra ohmic drop from the leakage current, $I_{leak}$, thereby requiring additional charge pumps or larger charge pumps in the high-voltage generator 106 (FIG. 1) and, consequently, having a negative impact on the charge pump design.

In accordance with the embodiment, an additional reference cell, the erased reference cell 408, is provided for each word line. The (11) erased reference cell 408 can be located in the edge portion of the word line adjacent to the (01) and (10) erase verify reference cells 406 where there are no bitlines 404. In order to cycle the erased reference cell 408 connected to a word line 402 with the memory cells 200 connected the word line 402 to track the Gm degradation of the memory cells 200 of the core memory cell array 102 during cycling, the erased reference cell 408 is cycled from the erased state (11) to the programmed state (00) and back to the erased state (11) during every program operation performed on a memory cell 200 connected to such word line 402. To function in this manner, the erased reference cell 408 is coupled to dummy bitlines 410 and the erased reference cell 408 utilizes the same threshold voltage, Vt, as the erased verify reference cell 406 Vt.

During an erase operation in accordance with this embodiment, before an erase verify operation is performed on the word lines 402, an erase verify learning routine in accordance with either a first embodiment or a second embodiment is performed under the control of the controller 104 (FIG. 1) to adjust either the erase verify gate voltage of the erase verify reference cells 406 or the erase verify gate voltage of the memory cells 200.

Figure 5:
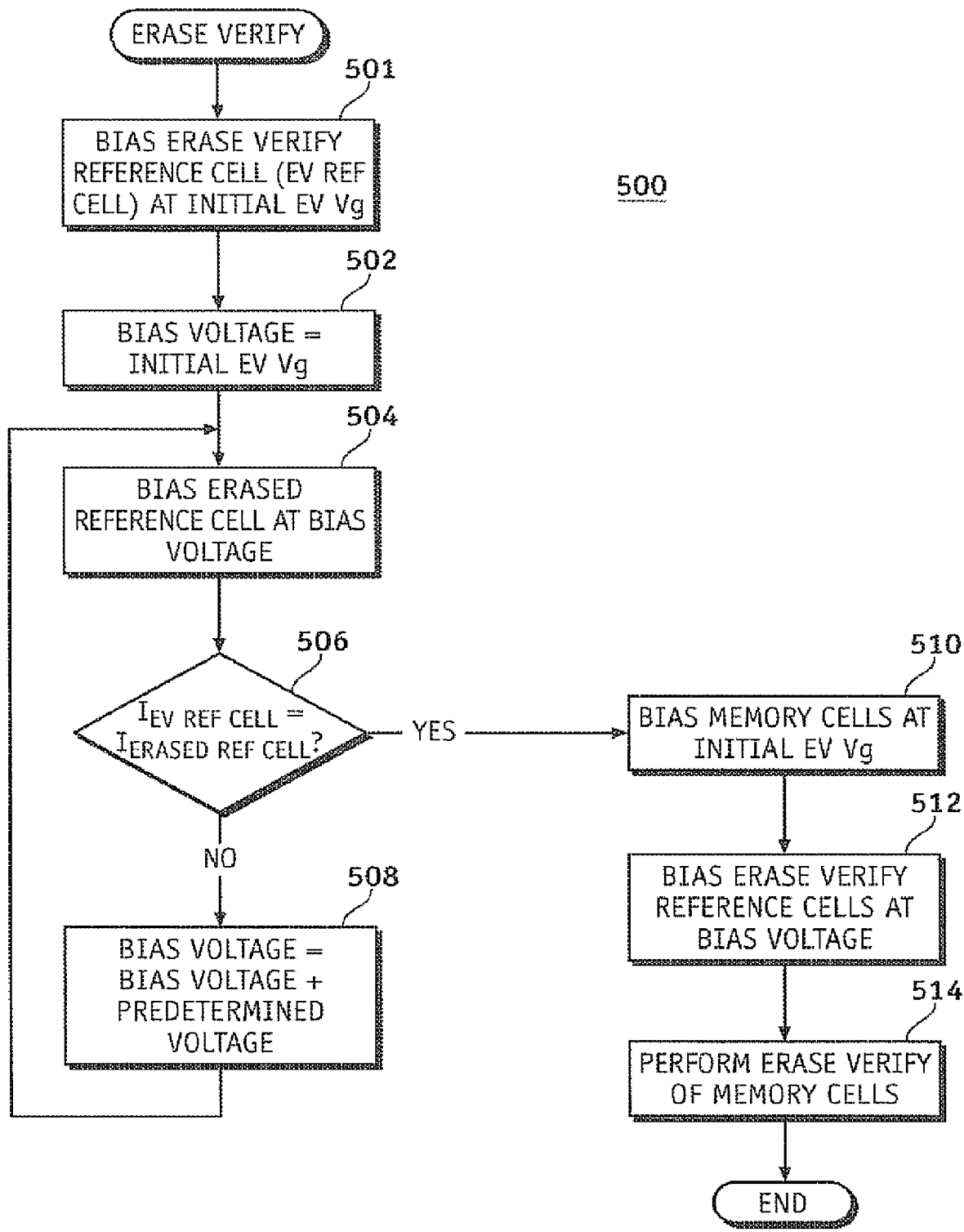
FIG. 5 is a flow chart of an erase verify operation of the semiconductor memory device of FIG. 1 in accordance with the embodiment.

FIG. 5 shows a flow chart 500 of an erase verify learning routine performed by the controller 106 in accordance with a first embodiment wherein erase verify can be performed by biasing the erase verify reference cell 406 at an initial erase verify gate voltage and generating a constant erase verify current ($I_{EV}$). The erase verify learning routine 500 begins by determining an erase verify gate voltage utilizing the erased reference cell 408. Initially, the erase verify reference cell 406 is biased at the initial erase verify gate voltage 501. Then, a bias voltage is set equal to the initial erase verify gate voltage 502. The erased reference cell 408 is then biased at the bias voltage 504. The current of the erased reference cell 408 is then compared 506 to the current of the erase verify reference cell 406. If the current of the erase verify reference cell 406 and the current of the erased reference cell 408 are not equal 506, the bias voltage is incremented by a predetermined voltage 508, the erased reference cell 408 is biased by the new bias voltage 504 and the current of the erased reference cell 408 is again compared 506 to the current of the erase verify reference cell 406.

The steps of comparing the currents 506, incrementing the bias voltage 508, biasing the erased reference cell 408 with the new bias voltage 504, and comparing the currents 506 are repeated until the current of the erase verify reference cell 406 is equivalent 506 to the current of the erased reference cell 408. The currents will be equivalent when the bias voltage equals the gate voltage of the cycled memory cell 200. The bias voltage is incrementally increased (i.e., not decreased) because the gate voltage of the cycled memory cell 200 is greater than the initial erase verify gate voltage due to Gm degradation of the erased reference cell 408.

When the currents are equivalent 506, the memory cells 200 are biased at the initial erase verify gate voltage 510 and the erase verify reference cells 406 are biased 512 at the bias voltage calculated during the erase verify learning routine 500. The erase verify operation 514 is then performed for the memory cells 200 utilizing the current of the erase verify reference cell 406.

Figure 6:
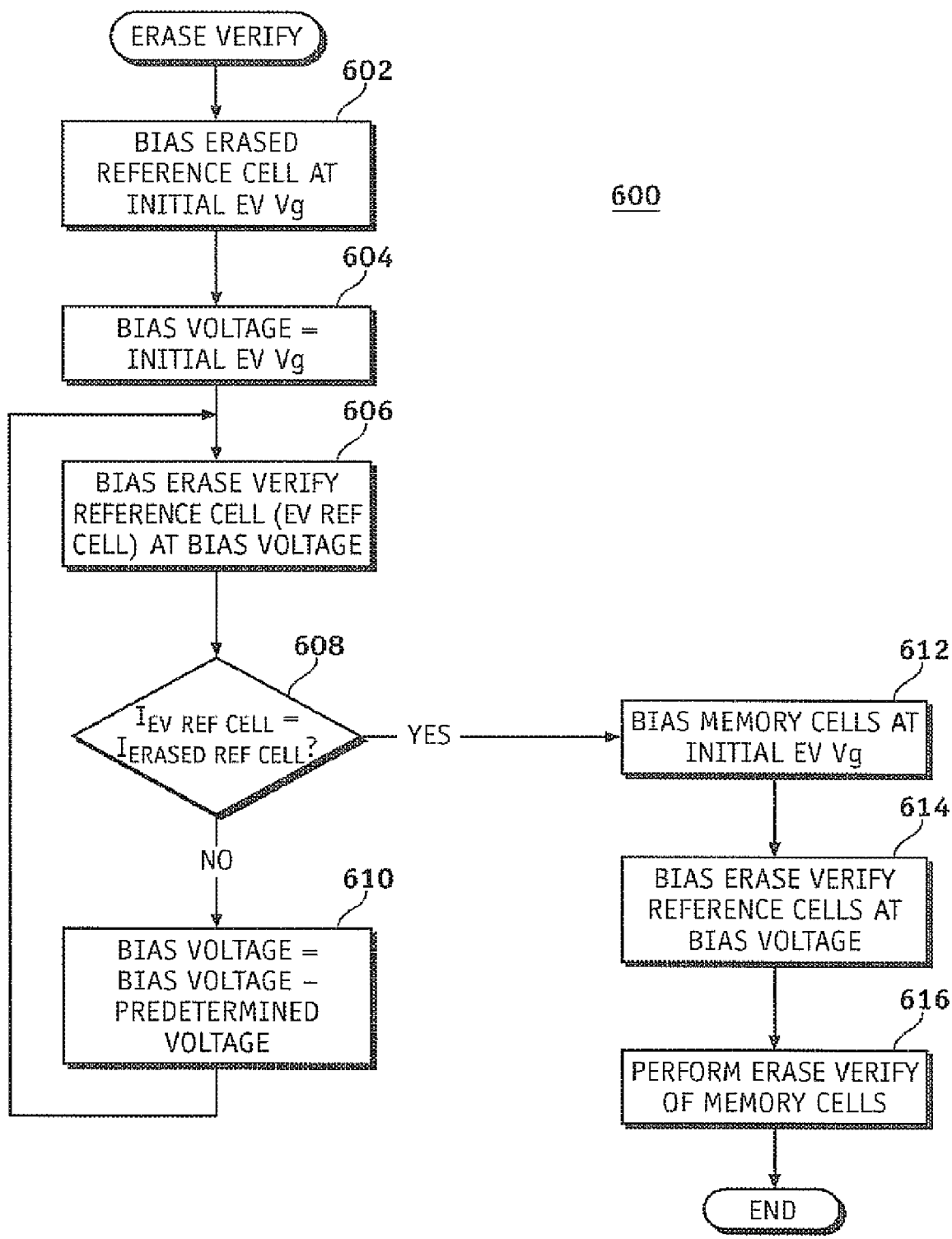
FIG. 6 is a flow chart of an alternate erase verify operation of the semiconductor memory device of FIG. 1 in accordance with the embodiment.

Referring to FIG. 6, a flow chart 600 shows an erase verify learning routine performed by the controller 106 in accordance with a second embodiment. In accordance with the second embodiment, erase verify can be performed by biasing the memory cell 200 at an initial erase verify gate voltage and generating a constant erase verify current ($I_{EV}$) therefor. In this manner, the controller 106 trims a threshold voltage of the dynamic erased verify reference cells 406 to a threshold voltage equivalent to the erase-verified threshold voltage of the erased reference cell.

The erase verify learning routine 600 also begins by determining an erase verify gate voltage utilizing the erased reference cell 408. However, in accordance with the second embodiment, initially, the erased reference cell 408 is biased at the initial erase verify gate voltage 602 setting the current therein to the cycled erase verify current. Then, a bias voltage is set equal to the initial erase verify gate voltage 604. The erase verify reference cell 406 is then biased at the bias voltage 606. The current of the erased reference cell 408 is then compared 608 to the current of the erase verify reference cell 406. If the current of the erase verify reference cell 406 and the current of the erased reference cell 408 are not equal 608, the bias voltage is decreased by a predetermined voltage 610, the erase verify reference cell 406 is biased by the new bias voltage 606 and the current of the erased reference cell 408 is again compared 608 to the current of the erase verify reference cell 406.

The steps of comparing the currents 608, decreasing the bias voltage 610, biasing the erase verify reference cell 406 with the new bias voltage 606, and comparing the currents 608 are repeated until the current of the erase verify reference cell 406 is equivalent 608 to the current of the erased reference cell 408. The currents will be equivalent when the bias voltage equals the gate voltage of the cycled erased reference cell 408. The bias voltage is incrementally decreased because the gate voltage of the cycled erased reference cell 408 is less than the initial erase verify gate voltage due to Gm degradation of the erased reference cell 408.

When the currents are equivalent 608, the memory cells 200 are biased at the initial erase verify gate voltage 612 and the erase verify reference cells 406 are biased 614 at the bias voltage calculated during the erase verify learning routine 600. The erase verify operation 514 is then performed for the memory cells 200 utilizing the current of the erase verify reference cell 406.

Figure 7:
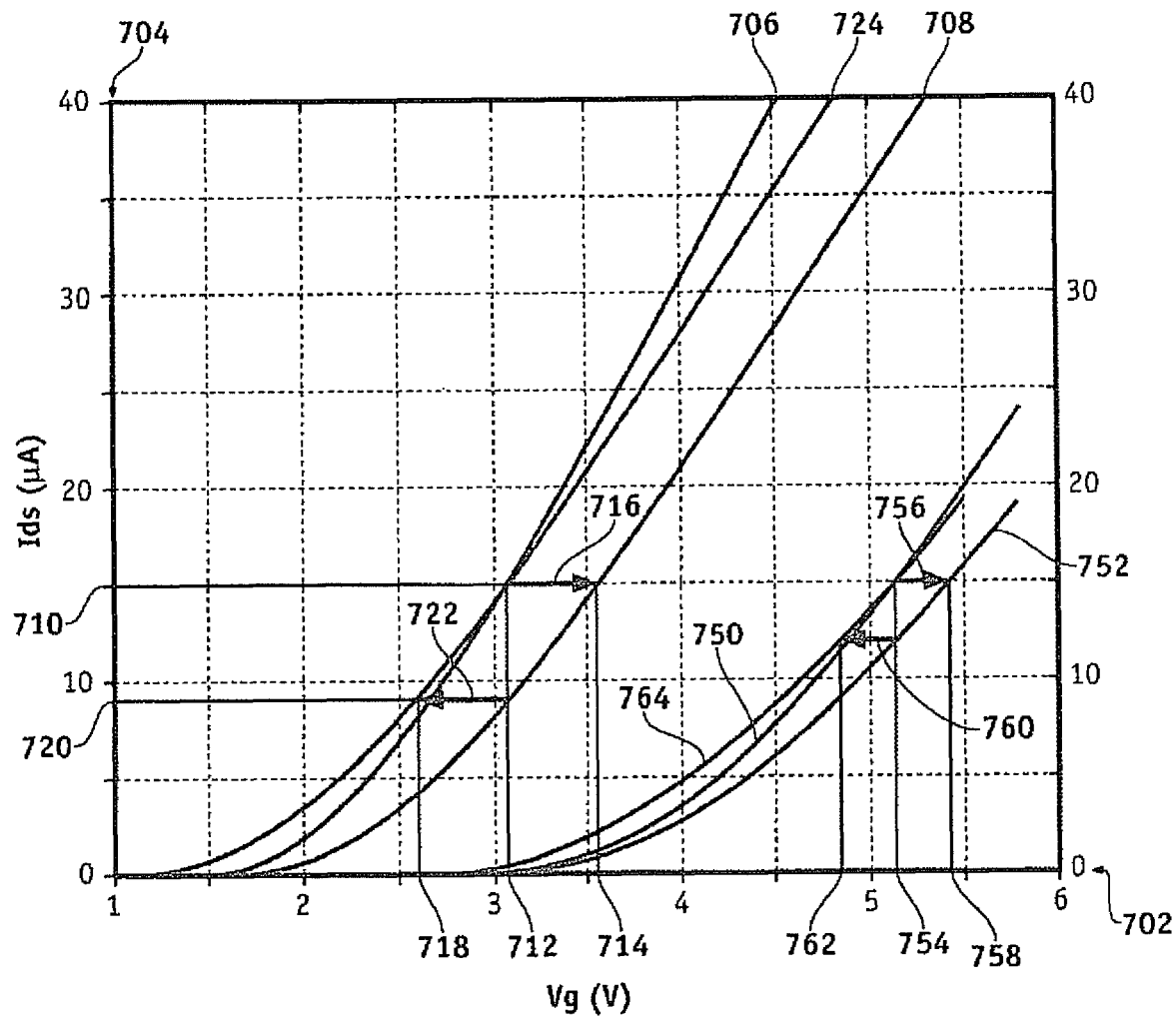
FIG. 7 is a graph showing application of verify operations in accordance with the embodiments of FIGS. 4 to 6 to compensate for overerasing and underprogramming.

FIG. 7 is a graphical depiction of the problem of overerase in an erased reference cell 408 and the operation of the embodiments described hereinabove to adaptively compensate for overerase of the erased reference cell 408 where the x-axis 702 shows the gate voltage of the erased reference cell 408 in volts and the y-axis 704 shows the drain-source current thereof in micro-amps.

A curve 706 shows the relationship of the gate voltage 702 to the current 704 for a fresh erased reference cell 408. As the erased reference cell 408 cycles, Gm degradation reduces the current 704 at any given voltage such that the curve 708 shows the relationship of the gate voltage 702 to the current 704 for a cycled erased reference cell 408. Thus, at an erase verify current ($I_{EV}$) 710, the gate voltage increases from an initial erase verify gate voltage 712 of the fresh erased reference cell 408 to a cycled cell gate voltage 714 of the cycled erased reference cell 408 by a change in the threshold voltage (ΔVt) 716.

Adaptive overerase compensation in accordance with the embodiments described hereinabove provides a decreased cycled reference gate voltage 718 at a cycled erase verify current 720 of a change in the threshold voltage 722. Thus, it can be seen that an overerase compensated curve 724 for the cycled erased reference cell 408 approximates the curve 706 for the fresh erased reference cell 408. The adaptive overerase compensation of these embodiments, by providing an adaptively compensated erased reference cell 408, provides a reference for the erase verify reference cells 406 that adaptively compensates for Gm degradation due to overerase as the memory cells 200 of the memory array 102 cycle because the erased reference cell is cycled with the memory cells 200. In this manner, the embodiments beneficially provide adaptive overerase compensation techniques which provide improved, reliable performance of memory operations over the life of the semiconductor memory device 100.

In addition to overerase, programmed cycled cells become effectively underprogrammed due to Gm degradation. Utilization of the adaptive compensation techniques taught hereinabove can also be applied to cycled cells during program verify to compensate for underprogramming. Referring to FIG. 7, a curve 750 shows the relationship between gate voltage 702 and current 704 during programming of a fresh erased reference cell 408. A curve 752 shows the same relationship during programming of a cycled erased reference cell 408 where an initial program gate voltage 754 at the initial current 710 increases by a change in threshold voltage (ΔVt) 756 to a cycled cell gate voltage 758. Utilization of the compensation techniques of the embodiments during program verify decreases the gate voltage 702 by a compensation value 760 to, for example, a gate voltage 762. Thus, it can be seen that a curve 764 representing the relationship of the gate voltage 702 to the current 704 of a compensated cycled underprogrammed erased reference cell 408 approximates the curve 750 of a fresh erased reference cell 408.

While exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims.

What is claimed is:

1. A semiconductor memory device comprising:
   at least one word line;
   one or more memory cells connected to each of the at least one word line; and
   two or more reference cells connected to each of the at least one word line, the two or more reference cells comprising an erased reference cell connected to each of the at least one word line and one or more dynamic reference cells connected to each of the at least one word line, wherein the erased reference cell is located adjacent to the one or more dynamic reference cells, and wherein the erased reference cell is not one of the one or more dynamic reference cells.

2. The semiconductor memory device of claim 1 further comprising one or more bitlines connected to the at least one word line, wherein the one or more memory cells are located at the connection of the at least one word line and the one or more bitlines, and wherein the erased reference cell is connected to the at least one word line at a location wherein none of the one or more bitlines are connected thereto.

3. The semiconductor memory device of claim 1 wherein the at least one word line includes a dummy bitline portion thereof, and wherein the erased reference cell connected to the at least one word line is located within the dummy bitline portion thereof.

4. The semiconductor memory device of claim 1 further comprising a controller coupled to the at least one word line and programming the one or more memory cells connected to the at least one word line, wherein the controller cycles the erased reference cell connected to the at least one word line whenever programming any of the one or more memory cells connected to the at least one word line.

5. The semiconductor memory device of claim 4 wherein the erased reference cell has an erase-verified threshold voltage associated therewith and the one or more reference cells further include one or more dynamic reference cells connected to each of the at least one word line, and wherein the controller trims the one or more dynamic reference cells to a threshold voltage equivalent to the erase-verified threshold voltage of the erased reference cell.

6. A semiconductor memory device comprising:
   at least one word line;
   one or more memory cells connected to each of the at least one word line; and
   one or more reference cells connected to each of the at least one word line, the one or more reference cells comprising an erased reference cell connected to each of the at least one word line, wherein an erase voltage of the one or more memory cells is verified in response to an erase verify gate voltage determined utilizing the erased reference cell, wherein the erase verify gate voltage is adaptively compensated for cycling degradation, wherein the erase voltage of the one or more memory cells is verified in a subsequent erase verify step, and wherein the erase verify step utilizes the compensated erase verify gate voltage.

7. The semiconductor memory device of claim 6 further comprising an erase verify reference cell, wherein the erase verify gate voltage is determined by biasing the erase verify reference cell at an initial erase verify gate voltage, comparing a current of the erase verify reference cell with a current of the erased reference cell and, if the current of the erase verify reference cell and the current of the erased reference cell are not equal, incrementally increasing by a predetermined voltage a gate voltage on the erased reference cell.

8. The semiconductor memory device of claim 7 wherein the current of the erase verify reference cell is compared with the current of the erased reference cell and the gate voltage on the erased reference cell is incrementally increased by the predetermined voltage until the current of the erase verify reference cell is equivalent to the current of the erased reference cell.

9. The semiconductor memory device of claim 8 wherein the erase verify reference cell is biased at the initial erase verify gate voltage and the one or more memory cells are biased at the gate voltage of the erased reference cell when the current of the erase verify reference cell is equivalent to the current of the erased reference cell to verify the erase voltage of the one or more memory cells as compared to the gate voltage of the erase verify reference cell.

10. The semiconductor memory device of claim 6 further comprising an erase verify reference cell, wherein the erase verify gate voltage is determined by biasing the erase reference cell at an initial erase verify gate voltage, comparing a current of the erased reference cell with a current of the erase verify reference cell and, if the current of the erased reference cell and the current of the erase verify reference cell are not equal, incrementally increasing by a predetermined voltage a gate voltage on the erase verify reference cell.

11. The semiconductor memory device of claim 10 wherein the current of the erased reference cell is compared with the current of the erase verify reference cell and the gate voltage on the erase verify reference cell incrementally increased by the predetermined voltage until the current of the erased reference cell is equivalent to the current of the erase verify reference cell.

12. The semiconductor memory device of claim 11 wherein the one or more memory cells are biased at the initial erase verify gate voltage and the erase verify reference cell is biased at the gate voltage of the erase verify reference cell when the current of the erased reference cell is equivalent to the current of the erase verify reference cell to verify the erase voltage of the one or more memory cells as compared to the gate voltage of the erase verify reference cell.

* * * * *